(12) United States Patent
Nomann et al.

(10) Patent No.: US 11,004,695 B2
(45) Date of Patent: *May 11, 2021

(54) POWER SEMICONDUCTOR MODULE ARRANGEMENT HAVING A BASE PLATE AND A CONTACT ELEMENT

(71) Applicant: Infineon Technologies AG, Neubiberg (DE)

(72) Inventors: Marianna Nomann, Ruethen (DE); Elmar Kuehle, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/907,489

(22) Filed: Jun. 22, 2020

(65) Prior Publication Data

US 2020/0321223 A1   Oct. 8, 2020

Related U.S. Application Data

(60) Continuation of application No. 16/588,535, filed on Sep. 30, 2019, now Pat. No. 10,741,418, which is a (Continued)

(30) Foreign Application Priority Data

May 12, 2017 (EP) .................................... 17170743

(51) Int. Cl.
*H01L 21/48* (2006.01)
*H01L 23/498* (2006.01)
(Continued)

(52) U.S. Cl.
CPC ........ *H01L 21/4875* (2013.01); *H01L 21/481* (2013.01); *H01L 23/142* (2013.01);
(Continued)

(58) Field of Classification Search
CPC ... H01L 21/4875; H01L 23/49; H01L 23/142; H01L 21/481; H01L 23/49811; H01L 24/48
See application file for complete search history.

(56) References Cited

U.S. PATENT DOCUMENTS 10,510,559 B2 * 12/2019 Nomann ................. H01L 23/49
2012/0127684 A1 5/2012 Matsumoto et al.
(Continued)

FOREIGN PATENT DOCUMENTS

DE 102014114808 A1 4/2016
DE 102016205303 A1 10/2016

*Primary Examiner* — Anthony Ho
(74) *Attorney, Agent, or Firm* — Murphy, Bilak & Homiller, PLLC

(57) ABSTRACT

A power semiconductor module arrangement includes: a base plate; a contact element configured to, when the base plate is arranged in a housing, provide an electrical connection between an inside and an outside of the housing; an electrically insulating first layer connected to the base plate, the contact element being connected to the electrically insulating first layer; a third layer on the base plate or on the electrically insulating first layer; and a second layer on the electrically insulating first layer or on the contact element. The electrically insulating first layer is mounted on the base plate such that the third layer attaches the electrically insulating first layer to the base plate. The contact element is mounted on the electrically insulating first layer such that the second layer attaches the contact element to the electrically insulating first layer.

10 Claims, 2 Drawing Sheets

Related U.S. Application Data division of application No. 15/977,119, filed on May 11, 2018, now Pat. No. 10,510,559.

(51) Int. Cl.
  *H01L 23/14* (2006.01)
  *H01L 23/49* (2006.01)
  H01L 23/15 (2006.01)
  H01L 23/00 (2006.01)

(52) U.S. Cl.
  CPC ........ *H01L 23/49* (2013.01); *H01L 23/49811* (2013.01); *H01L 23/15* (2013.01); *H01L 23/49833* (2013.01); *H01L 24/48* (2013.01); *H01L 2224/48091* (2013.01); *H01L 2224/48175* (2013.01); *H01L 2224/48472* (2013.01); *H01L 2224/73265* (2013.01); *H01L 2924/13055* (2013.01); *H01L 2924/13091* (2013.01)

(56) References Cited

U.S. PATENT DOCUMENTS

2015/0001700 A1    1/2015  Hartung et al.
2015/0091551 A1    4/2015  Kanschat et al.

* cited by examiner

POWER SEMICONDUCTOR MODULE ARRANGEMENT HAVING A BASE PLATE AND A CONTACT ELEMENT

TECHNICAL FIELD

The instant disclosure relates to a power semiconductor module arrangement and to a method for producing a power semiconductor module arrangement.

BACKGROUND

Power semiconductor module arrangements often include a base plate within a housing. A main substrate is arranged on the base plate. A semiconductor arrangement including a plurality of controllable semiconductor elements (e.g., two IGBTs in a half-bridge configuration) is arranged on the main substrate. A contact element, which allows for contacting the semiconductor arrangement from outside the housing, is usually arranged on a separate substrate that is arranged on the same baseplate as the main substrate, but distant from the main substrate. Electrical connections between the contact element on the separate substrate and the semiconductor arrangement on the main substrate usually include wires such as bonding wires, for example. The main substrate and the separate substrate usually each comprise a substrate layer (e.g., a ceramic layer), a first metallization layer deposited on a first side of the substrate layer and a second metallization layer deposited on a second side of the substrate layer. In some applications the substrates, in particular the metallization layers of the substrates, may be exposed to corrosive gases. When exposed to corrosive gases and further under the influence of electric fields and possibly moisture, dendritic structures may be formed from mobile metal ions of the metallic layer and anions from the corrosive gas (e.g., $S^{2-}$).

There is a need for a power semiconductor module arrangement that avoids formation of dendritic structures and provides a cost-effective, simple solution that may be manufactured by means of an easy manufacturing method.

SUMMARY

The power semiconductor module arrangement includes a base plate configured to be arranged in a housing, a contact element configured to, when the base plate is arranged within the housing, provide an electrical connection between the inside and the outside of the housing, and a connecting element configured to connect the contact element to the base plate. The connecting element comprises a first electrically insulating layer, a second electrically insulating layer configured to attach the contact element to the first electrically insulating layer, and a third electrically insulating layer configured to attach the first electrically insulating layer to the base plate.

A power semiconductor module arrangement comprises a base plate to be arranged in a housing, and a contact element configured to, when the base plate is arranged within the housing, provide an electrical connection between the inside and the outside of the housing. A method for producing the power semiconductor module arrangement comprises connecting a first electrically insulating layer to the base plate and connecting the contact element to the first electrically insulating layer. Connecting the first electrically insulating layer to the base plate comprises forming a third electrically insulating layer on the base plate or on the first electrically insulating layer and mounting the first electrically insulating layer on the base plate such that the third electrically insulating layer attaches the first electrically insulating layer to the base plate. Connecting the contact element to the first electrically insulating layer comprises forming a second electrically insulating layer on the first electrically insulating layer or on the contact element and mounting the contact element on the first electrically insulating layer such that the second electrically insulating layer attaches the contact element to the first electrically insulating layer.

Those skilled in the art will recognize additional features and advantages upon reading the following detailed description, and upon viewing the accompanying drawings.

BRIEF DESCRIPTION OF THE DRAWINGS

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
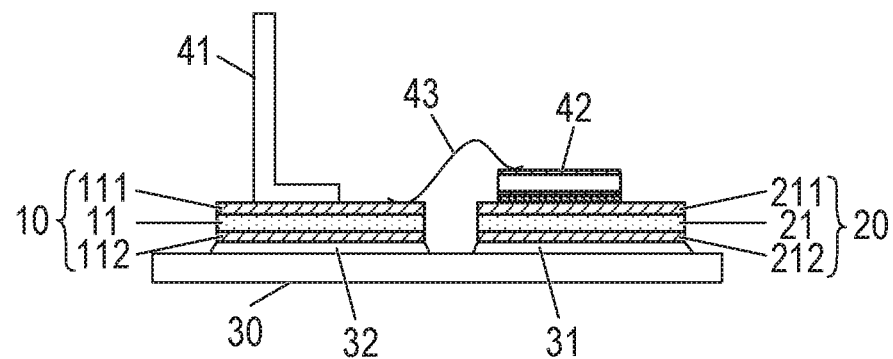
FIG. 1 is a cross-sectional view of a power semiconductor module arrangement including a main substrate and a separate substrate.

Referring to FIG. 1, a power semiconductor module arrangement is illustrated. The power semiconductor module arrangement includes a base plate 30. A main substrate 20 is arranged on the base plate 30. The main substrate 20 includes a dielectric insulation layer (21), a (structured) first metallization layer 211 attached to the dielectric insulation layer 21, and a second metallization layer 212 attached to the dielectric insulation layer 21. The dielectric insulation layer 21 is disposed between the first and second metallization layers 211, 212.

Each of the first and second metallization layers 211, 212 may consist of or include one of the following materials: copper, a copper alloy; aluminium; an aluminium alloy; any other metal or alloy that remains solid during the operation of the power semiconductor module arrangement. The main substrate 20 may be a ceramic substrate, that is, a main substrate in which the dielectric insulation layer 21 is a ceramic, e.g., a thin ceramic layer. The ceramic may consist of or include one of the following materials: aluminium oxide; aluminium nitride; zirconium oxide; silicon nitride; boron nitride; or any other dielectric ceramic. For instance, the main substrate 20 may, e.g., be a Direct Copper Bonding (DCB) substrate, a Direct Aluminium Bonding (DAB) substrate, or an Active Metal Brazing (AMB) substrate. The main substrate 20 may also be a conventional printed circuit board (PCB) having a non-ceramic dielectric insulation layer 21. For instance, a non-ceramic dielectric insulation layer 21 may consist of or include a cured resin.

One or more semiconductor bodies 42 may be arranged on the main substrate 20. The one or more semiconductor bodies 42 may form a semiconductor arrangement on the main substrate 20. The one or more semiconductor bodies 42 may be electrically and mechanically connected to the main substrate 20 by an electrically conductive connection layer (not illustrated in FIG. 1). Such an electrically conductive connection layer may be a solder layer, a layer of an electrically conductive adhesive, or a layer of a sintered metal powder, e.g., a sintered silver powder, for example. The main substrate 20 may be electrically and mechanically connected to the base plate 30 by a first connection layer 31. The first connection layer 31 may be a solder layer, a layer of an electrically conductive adhesive, or a layer of a sintered metal powder, e.g., a sintered silver powder, for example.

The base plate 30 may be arranged in a housing (not illustrated) to form a power semiconductor module. In order to facilitate an electrical connection of the elements and components arranged on the base plate 30, e.g., the main substrate 21 and/or the semiconductor bodies 42 arranged on the main substrate 21, to external components outside the housing such as a supply terminal, an electrical load, or a controller, for example, the power semiconductor module arrangement includes a contact element 41. The contact element 41 is arranged on the base plate 30. Generally, the contact element 41 is arranged on the same surface as the main substrate 20 or any other elements that may be arranged on the base plate 30. The contact element 41 is connected to the base plate 30 by means of a separate substrate 10. The separate substrate 10 is arranged on the base plate 30, spaced apart from the main substrate 21. The separate substrate 10 includes a dielectric insulation layer 11, a first metallization layer 111 attached to the dielectric insulation layer 11, and a second metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminium; an aluminium alloy; or any other metal or alloy that remains solid during the operation of the power semiconductor module arrangement. The separate substrate 10 may be a ceramic substrate, that is, a separate substrate in which the dielectric insulation layer 11 is a ceramic, e.g., a thin ceramic layer. The ceramic may consist of or include one of the following materials: aluminium oxide; aluminium nitride; zirconium oxide; silicon nitride; boron nitride; any other dielectric ceramic. For instance, the separate substrate 10 may be, e.g., a Direct Copper Bonding (DCB) substrate, a Direct Aluminium Bonding (DAB) substrate, or an Active Metal Brazing (AMB) substrate. The separate substrate 10 may also be a conventional printed circuit board (PCB) having a non-ceramic dielectric insulation layer 11. For instance, a non-ceramic dielectric insulation layer 11 may consist of or include a cured resin.

The separate substrate 10 may be electrically and mechanically connected to the base plate 30 by a second connection layer 32. The second connection layer 32 may be a solder layer, a layer of an electrically conductive adhesive, or a layer of a sintered metal powder, e.g., a sintered silver powder, for example.

An electrical connection between the main substrate 20 and the separate substrate 10 includes at least one bonding wire 43. Each bonding wire 43 is, at respective bonding locations, wire-bonded directly to both the first metallization layer 111 of the separate substrate 10 and one of the semiconductor bodies 42 arranged on the main substrate 20. Instead of to one of the semiconductor bodies 42, a bonding wire 43 may be wire-bonded to the first metallization layer 211 of the main substrate 20. The first metallization layer 111 of the separate substrate 10 provides for an electrical connection between the at least one bonding wire 43 and the contact element 41. If a bonding wire 43 is wire-bonded to the first metallization layer 211 of the main substrate 20, the first metallization layer 211 of the main substrate 20 provides for an electrical connection between the bonding wire 43 and at least one of the semiconductor bodies 42 arranged on the main substrate 20.

The contact element 41 may consist of or include a metal or metal alloy. For example, the contact element 41 may consist of or include copper. The contact element 41 may have an L-shape, for example. According to one example, when the contact element 41 is connected to the separate substrate 10, a first leg of the L-shaped contact element 41 may be essentially parallel to the base plate 30 and a second leg of the L-shaped contact element may be essentially perpendicular to the base plate 30. The contact element 41 (e.g., the first leg of the contact element 41) only partially covers an upper surface of the first metallization layer 111 of the separate substrate 41. There are areas of the upper surface of the first metallization layer 111 that remain uncovered by the contact element 41. In some applications, the power semiconductor module arrangement may be exposed to corrosive gases such as $Cl^-$, $H_2S$, $SO_x$, or $NO_x$, for example. When exposed to corrosive gases and further under the influence of electric fields and possibly moisture, dendritic structures may form from mobile metal ions (e.g., Cu, Ag, etc.) of the first metallization layer 111 of the separate substrate 10 and anions (e.g., $S^{2-}$) that are present in the corrosive gas. A dendrite is a characteristic tree-like structure of crystals. Dendritic growth in metal layers has large consequences with regard to material properties and is generally unwanted.

Figure 2:
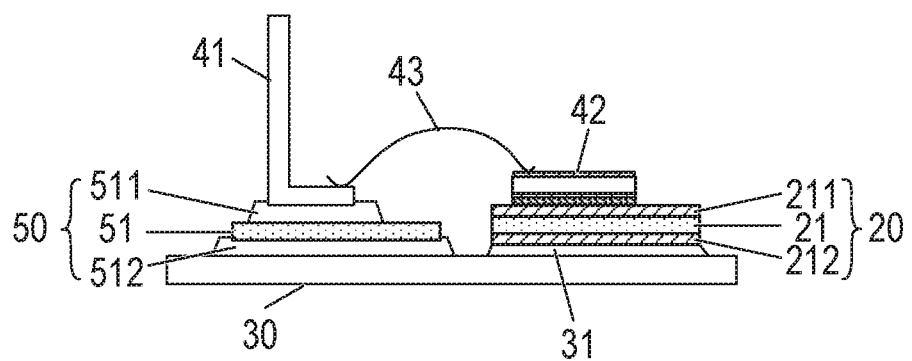
FIG. 2 is a cross-sectional view of an example of a power semiconductor module arrangement.

Referring to FIG. 2, according to one example, in order to avoid the formation of dendritic structures, the separate substrate 10 of FIG. 1 is replaced by a connecting element 50. The connecting element 50 includes a first electrically insulating layer 51. The connecting element 50 further includes a second electrically insulating layer 511 and a third electrically insulating layer 512. The second electrically insulating layer 511 is configured to attach the contact element 41 to the first electrically insulating layer 51. The third electrically insulating layer 512 is configured to attach the first electrically insulating layer 51 to the base plate 30.

According to one example, no mechanical tensions are introduced to the first electrically insulating layer 51 during the mounting process, i.e., when the contact element 41 is attached to the base plate 30. The first electrically insulating layer 51, therefore, may include an inexpensive organic or an inorganic material. According to one example, the first electrically insulating layer 51 consists of or includes a raw ceramic material such as $Al_2O_3$, $ZrO_2$, MgO, CaO, BaO, AlN, $Si_3N_4$, BeO or $CeO_2$, for example. According to another example, the first electrically insulating layer 51 consists of or includes a plastic material such as polyethylene terephthalate (PET), polyethylene naphthalate (PEN), polycarbonate, polyvinylbutryral, polyacrylate, polyimide, polynorbornene, polyethersulfone (PES), or the like. Any combinations of such plastic materials as well as combinations of plastic and ceramic materials are also possible. According to an even further example, the first electrically insulating layer 51 consists of or includes a composite material.

The first insulating layer 51 may have a first thickness. The first thickness is a dimension of the first electrically insulating layer 51 in a direction perpendicular to the base plate 30, when the first electrically insulating layer 51 is connected to the base plate 30. The first thickness may be between about 100 µm and about 1000 µm.

The second electrically insulating layer 511 may provide for a solid (substance-to-substance bond) and positive (positive-locking) connection between the contact element 41 and the first electrically insulating layer 51. The second electrically insulating layer 511 may consist of or include an electrically insulating material. According to one example, the second electrically insulating layer 511 consists of or includes an adhesive such as a non-reactive or a reactive adhesive. A non-reactive adhesive may consist of or include a polymer, natural rubber, polychloroprene or ethylene-vinyl acetate, for example. A reactive adhesive may consist of or include polyester resin, polyols, acrylic polymers, epoxies, urethanes, polyimides, or cyanoacrylates, for example. The second electrically insulating layer 511 may have a second thickness. The second thickness is a dimension of the second electrically insulating layer 511 in a direction perpendicular to the base plate 30, when the second electrically insulating layer 511 is connected to the base plate 30. The second thickness may be between about 50 µm and about 1000 µm.

The third electrically insulating layer 512 may provide for a solid (substance-to-substance bond) and positive (positive-locking) connection between the first electrically insulating layer 51 and the base plate 30. The second electrically insulating layer 511 may consist of or include an electrically insulating material. According to one example, the second electrically insulating layer 511 consists of or includes an adhesive such as a non-reactive or a reactive adhesive. A non-reactive adhesive may consist of or include a polymer, natural rubber, polychloroprene or ethylene-vinyl acetate, for example. A non-reactive adhesive may also include electrically conductive materials such as Cu, for example, or may include particles of electrically insulating materials, e.g., ceramic materials. A reactive adhesive may consist of or include polyester resin, polyols, acrylic polymers, epoxies, urethanes, polyimides, or cyanoacrylates, for example. A reactive adhesive may also include electrically conductive materials such as Cu, for example, or may include particles of electrically insulating materials, e.g., ceramic materials. The third electrically insulating layer 512 may have a third thickness. The third thickness is a dimension of the third electrically insulating layer 512 in a direction perpendicular to the base plate 30, when the third electrically insulating layer 512 is connected to the base plate 30. The third thickness may be between about 50 µm and about 1000 µm.

The second electrically insulating layer 511 and the third electrically insulating layer 512 may be identical. i.e., consist of or include the same materials and/or have the same thickness. However, according to another example, the second electrically insulating layer 511 may include different materials than the third electrically insulating layer 512, and/or the second electrically insulating layer 511 may have a second thickness that is different from the third thickness of the third electrically insulating layer 512.

No additional holding mechanisms or elements are needed to hold the contact element 41 in place, as the connecting element 50 (with the second and third electrically insulating layers 511, 512) provides for a solid (substance-to-substance bond) and positive (positive-locking) connection between the contact element 41 and the base plate 30.

According to one example, an electrical connection between the contact element 41 and other components or elements arranged on the base plate 30 (e.g., the main substrate 20 and/or the semiconductor bodies 42 (or any other components) arranged on the main substrate 20) includes one bonding wire 43. According to another example, an electrical connection between the contact element 41 and other components or elements arranged on the base plate 30 includes more than one bonding wire 43 (not illustrated in FIG. 2). Each of the at least one bonding wire 43 is, at respective bonding locations, wire-bonded directly to both the contact element 41 and one of the semiconductor bodies 42 arranged on the main substrate 20. According to one example, the at least one bonding wire 43 is wire-bonded to an upper surface of the first leg of an L-shaped contact element 41. An upper surface of the first leg of an L-shaped contact element 41 is a surface facing away from the base plate 30. Instead of to one of the semiconductor bodies 42, a bonding wire 43 may also be wire-bonded to the first metallization layer 211 of the main substrate 20, for example. If a bonding wire 43 is wire-bonded to the first metallization layer 211 of the main substrate 20, the first metallization layer 211 of the main substrate 20 provides for an electrical connection between the bonding wire 43 and at least one of the semiconductor bodies 42 arranged on the main substrate 20.

Generally, an electrical connection between the contact element 41 and a semiconductor body 42 arranged on the main substrate 20 may consist of or include one of the following electrically conductive elements: a wire (e.g., a bonding wire), a single metal sheet, a metal bar, a conductor trace of an electrically insulated carrier (substrate), a solder layer, a layer of sintered metal powder, an electrically conductive adhesive, or it may consist of or include any combination of two or more of the mentioned elements. In case of the two or more electrically conductive elements, the elements may be electrically connected in parallel and/or in series.

Figure 3A:
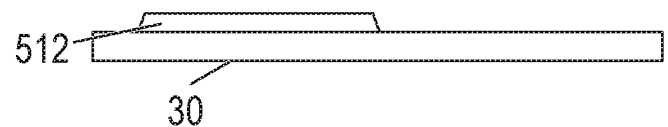
FIGS. 3A through 3D schematically illustrate an example of a method for producing a power semiconductor module arrangement.
Figure 3B:
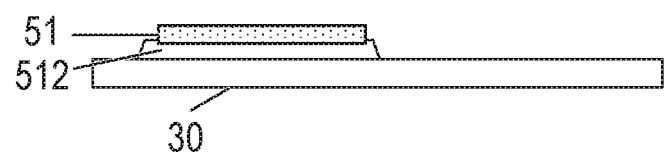

Referring to FIGS. 3A to 3D, an example of a method for producing a power semiconductor module arrangement is described. Referring to FIG. 3A, a third electrically insulating layer 512 may be applied to a base plate 30. Referring to FIG. 3B, the first electrically insulating layer 51 may then be applied to the third electrically insulating layer 512. As has been described above, the third electrically insulating layer 512 may consist of or include an adhesive. After applying the first electrically insulating layer 51 to the third electrically insulating layer 512, the third electrically insulating layer 512 may hold the first insulating layer 51 in place and connect the first insulating layer 51 to the base plate 30. The third electrically insulating layer 512 may be deformed when the first electrically insulating layer 51 is applied. For example, the first insulating layer 51 may be pressed onto the third insulating layer 512 by applying a small amount of pressure to the first insulating layer 51. The first insulating layer 51 may settle into the material of the third insulating layer 512 such that the third insulating layer 512 covers a bottom surface of the first insulating layer 51 and further at least partly covers the side surfaces of the first insulating layer 51. A bottom surface of the first insulating layer 51 is a surface facing towards the base plate 30. Side surfaces of the first electrically insulating layer 51 are surfaces that are essentially perpendicular to the base plate 30.

According to another example, the third electrically insulating layer 512 is applied to the first electrically insulating layer 51 instead of to the base plate 30. The first electrically insulating layer 51 together with the third electrically insulating layer 512 applied thereon is then mounted to the base plate 30. As has been explained above, the third electrically insulating layer 512 may hold the first insulating layer 51 in place and connect the first insulating layer 51 to the base plate 30. The third electrically insulating layer 512 may also be deformed when the first electrically insulating layer 51 and the third electrically insulating layer 512 are mounted to the base plate 30.

Figure 3C:
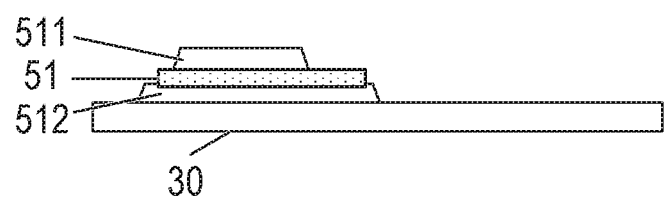

Now referring to FIG. 3C, the second electrically insulating layer 511 is applied to the first electrically insulating layer 51. The cross-sectional area of the second electrically insulating layer 511 may be smaller than the cross-sectional area of the first electrically insulating layer 51 such that the second electrically insulating layer 511 only partially covers the top surface of the first electrically insulating layer 51. For example, the cross-sectional area of the second electrically insulating layer 511 may be less than 100%, less than 90%, less than 80% or less than 70% of the cross-sectional area of the first electrically insulating layer 51. In other words, the second electrically insulating layer 511 may cover less than 100%, less than 90%, less than 80% or less than 70% of the top surface of the first electrically insulating layer 51, wherein the top surface of the first electrically insulating layer 51 is a surface facing away from the base plate. The cross-sectional area of the second electrically insulating layer 511 may, for example, correspond to the cross-sectional area of the first leg of an L-shaped contact element 41. The cross-sectional area of the first electrically insulating layer 51 may be essentially identical to the cross-sectional area of the second electrically insulating layer 511 or may be greater than the cross-sectional area of the second electrically insulating layer 511. If the cross-sectional area of the first electrically insulating layer 51 is greater than the cross-sectional area of the second electrically insulating layer 511, this may provide for more mechanical stability of the connecting element 50 and, therefore, the contact element 41.

Figure 3D:
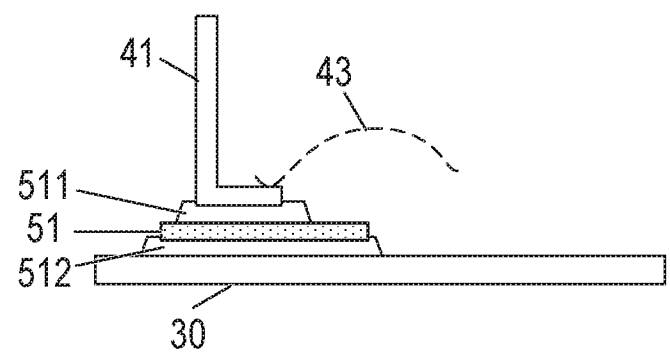

Referring to FIG. 3D, the contact element 41 is applied to the second electrically insulating layer 511 and is thereby fixed to the first electrically insulating layer 51. After applying the contact element 41 to the second electrically insulating layer 511, the second electrically insulating layer 511 may hold the contact element 41 in place and connect the contact element 41 to the first electrically insulating layer 51. The second electrically insulating layer 511 may be deformed when the contact element 41 is applied. For example, the contact element 41 may be pressed onto the second insulating layer 511 by applying a small amount of pressure to the contact element 41. The contact element 41 may settle into the material of the second insulating layer 511 such that the second insulating layer 511 covers a bottom surface of the contact element 41 and further at least partly covers the side surfaces of the contact element 41. A bottom surface of the contact element 41 is a surface facing towards the first electrically insulating layer 51. Side surfaces of the contact element 41 are surfaces that are essentially perpendicular to the first electrically insulating layer 51.

The second electrically insulating layer 511 and the contact element 41 may be attached to the first electrically insulating layer 51 after connecting the first electrically insulating layer 51 to the base plate 30. According to another example, the contact element 41 is attached to the first electrically insulating layer 51 before the first electrically insulating layer 51 is mounted on the base plate 30. The connecting element 50 may be mounted on the base plate 30 before a main substrate 20 or any other components are mounted on the base plate 30. It is, however, also possible to mount the connecting element 50 on the base plate 30 only after the main substrate 20 or any other components are mounted on the base plate 30.

Electrical connections such as bonding wires 43, for examples, between the contact element 41 and the main substrate 20 or any other components that are mounted on the base plate 30 are usually formed only after all components have been mounted on the base plate.

The base plate 30 may be arranged in a housing (not illustrated). The housing may be a so-called PrimePack, e.g., PrimePack 2, PrimePack 3 or PrimePack with .XT, IHM-/IHV-B, or 62 mm-Package, for example. Any other housings, however, are possible which include contact elements. Each of the semiconductor bodies 42 arranged on the main substrate 20 may include an GBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable controllable semiconductor element. Power semiconductor modules are generally available in various configurations as well as voltage and current classes.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A power semiconductor module arrangement, comprising:
 a base plate;
 a contact element configured to, when the base plate is arranged in a housing, provide an electrical connection between an inside and an outside of the housing;
 an electrically insulating first layer connected to the base plate, the contact element being connected to the electrically insulating first layer;
 a third layer on the base plate or on the electrically insulating first layer; and
 a second layer on the electrically insulating first layer or on the contact element,
 wherein the electrically insulating first layer is mounted on the base plate such that the third layer attaches the electrically insulating first layer to the base plate, wherein the contact element is mounted on the electrically insulating first layer such that the second layer attaches the contact element to the electrically insulating first layer.

2. The power semiconductor module arrangement of claim 1, further comprising:
a main substrate arranged on a surface of the base plate; and
one or more semiconductor bodies arranged on a surface of the main substrate that faces away from the base plate.

3. The power semiconductor module arrangement of claim 2, further comprising at least one electrical connection between the contact element and the main substrate.

4. The power semiconductor module arrangement of claim 3, wherein the at least one electrical connection between the contact element and the main substrate comprises at least one bonding wire between the contact element and the main substrate.

5. The power semiconductor module arrangement of claim 3, wherein the at least one electrical connection between the contact element and the main substrate comprises at least one bonding wire directly wire bonded to the contact element.

6. The power semiconductor module arrangement of claim 2, wherein the main substrate comprises a dielectric insulation layer disposed between a first and a second metallization layer.

7. The power semiconductor module arrangement of claim 1, wherein the electrically insulating first layer comprises at least one of $Al_2O_3$, $ZrO_2$, MgO, CaO, BaO, $CeO_2$, AlN, $Si_3N_4$, BeO, polyethylene terephthalate (PET), polyethylene naphthalate (PEN), polycarbonate, polyvinylbutryral, polyacrylate, polyimide, polynorbornene, polyethersulfone (PES), and a composite material.

8. The power semiconductor module arrangement of claim 1, wherein the contact element comprises a metal or metal alloy.

9. The power semiconductor module arrangement of claim 8, wherein the contact element comprises copper.

10. The power semiconductor module arrangement of claim 1, wherein the contact element has an L-shape.

* * * * *